(12) United States Patent
Neal et al.

(10) Patent No.: US 10,889,895 B2
(45) Date of Patent: Jan. 12, 2021

(54) DEPOSITION APPARATUS AND USE METHODS

(71) Applicant: United Technologies Corporation, Hartford, CT (US)

(72) Inventors: James W. Neal, Ellington, CT (US); David A. Litton, West Hartford, CT (US); Brian T. Hazel, Avon, CT (US); Michael J. Maloney, Marlborough, CT (US); Eric M. Jorzik, Danbury, CT (US)

(73) Assignee: Raytheon Technologies Corporation, Farmington, CT (US)

( * ) Notice: Subject to any disclaimer, the term of this patent is extended or adjusted under 35 U.S.C. 154(b) by 847 days.

(21) Appl. No.: 14/736,834

(22) Filed: Jun. 11, 2015

(65) Prior Publication Data
US 2015/0361556 A1 Dec. 17, 2015

Related U.S. Application Data

(60) Provisional application No. 62/011,103, filed on Jun. 12, 2014.

(51) Int. Cl.
*C23C 14/50* (2006.01)
*C23C 14/56* (2006.01)
(Continued)

(52) U.S. Cl.
CPC ............ *C23C 16/463* (2013.01); *C23C 14/22* (2013.01); *C23C 14/50* (2013.01); *C23C 14/505* (2013.01); *C23C 14/56* (2013.01); *C23C 14/566* (2013.01); *C23C 16/455* (2013.01); *C23C 16/458* (2013.01); *C23C 16/46* (2013.01);
(Continued)

(58) Field of Classification Search
None
See application file for complete search history.

(56) References Cited

U.S. PATENT DOCUMENTS 4,192,253 A * 3/1980 Aichert ................. C23C 14/225
118/712
4,681,773 A * 7/1987 Bean ..................... C23C 14/505
117/107

(Continued)

FOREIGN PATENT DOCUMENTS

DE 10205168 A1 * 8/2003 ........... C23C 14/568
DE 10205168 A1 8/2003

(Continued)

OTHER PUBLICATIONS

Sandhangshu Bose, "High Temperature Coatings", Nov. 27, 2017, Chapter 7, Butterworth-Heinemann (Elsevier), Oxford, United Kingdom. (Year: 2017).*

(Continued)

*Primary Examiner* — Karla A Moore
(74) *Attorney, Agent, or Firm* — Bachman & LaPointe, P.C.

(57) ABSTRACT

A deposition apparatus comprises: an infeed chamber; a preheat chamber; a deposition chamber; and optionally at least one of a cooldown chamber and an outlet chamber. At least a first of the preheat chamber and the cooldown chamber contains a buffer system for buffering workpieces respectively passing to or from the deposition chamber.

21 Claims, 6 Drawing Sheets

(51) Int. Cl.
 *C23C 14/30*    (2006.01)
 *C23C 14/02*    (2006.01)
 *C23C 14/58*    (2006.01)
 *C23C 16/46*    (2006.01)
 *C23C 14/22*    (2006.01)
 *C23C 16/455*    (2006.01)
 *C23C 16/458*    (2006.01)

(52) U.S. Cl.
 CPC .............. *C23C 14/02* (2013.01); *C23C 14/30* (2013.01); *C23C 14/58* (2013.01)

(56) References Cited

U.S. PATENT DOCUMENTS

| | | | | |
|---|---|---|---|---|
| 4,810,473 | A * | 3/1989 | Tamura | C30B 23/02 |
| | | | | 118/500 |
| 4,902,870 | A * | 2/1990 | Frind | B23K 9/328 |
| | | | | 118/50.1 |
| 5,225,246 | A * | 7/1993 | Beers | C23C 10/04 |
| | | | | 29/889.7 |
| 5,380,682 | A | 1/1995 | Edwards et al. | |
| 5,630,879 | A * | 5/1997 | Eichmann | C23C 14/02 |
| | | | | 118/500 |
| 5,792,267 | A * | 8/1998 | Marszal | B05B 12/20 |
| | | | | 118/500 |
| 5,882,415 | A * | 3/1999 | Helling | C23C 14/541 |
| | | | | 118/719 |
| 5,961,798 | A * | 10/1999 | Robinson | C23C 14/568 |
| | | | | 118/719 |
| 5,985,036 | A * | 11/1999 | Anderle | C23C 14/505 |
| | | | | 118/729 |
| 6,056,826 | A * | 5/2000 | Rick | C23C 14/505 |
| | | | | 118/500 |
| 6,447,854 | B1 * | 9/2002 | Rigney | C23C 14/083 |
| | | | | 427/255.19 |
| 6,589,351 | B1 * | 7/2003 | Bruce | C23C 14/246 |
| | | | | 118/723 EB |
| 6,641,511 | B2 | 11/2003 | Patel et al. | |
| 6,793,968 | B1 * | 9/2004 | Reymann | C23C 4/18 |
| | | | | 118/719 |
| 6,946,034 | B1 * | 9/2005 | Bruce | C23C 14/246 |
| | | | | 118/719 |
| 8,349,086 | B2 | 1/2013 | Bernaski et al. | |
| 8,603,582 | B2 | 12/2013 | Bernaski et al. | |
| 2007/0196574 | A1 * | 8/2007 | Berndt | C23C 14/505 |
| | | | | 427/248.1 |
| 2008/0223291 | A1 * | 9/2008 | Bruce | C23C 14/30 |
| | | | | 118/50.1 |
| 2012/0196030 | A1 | 8/2012 | Neal et al. | |
| 2012/0282402 | A1 | 11/2012 | Neal et al. | |

FOREIGN PATENT DOCUMENTS

| | | |
|---|---|---|
| JP | 2013168448 A | 8/2013 |
| WO | 2014/144189 A1 | 9/2014 |

OTHER PUBLICATIONS

European Search Report for EP Patent Application No. 15171956.4, dated Oct. 28, 2015.

Peter Jansohn, ed., "Modern Gas Turbine Systems: High Efficiency, Low Emission, Fuel Flexible Power Generation", Aug. 31, 2013, p. 619, Woodhead Publishing Ltd. (Elsevier), Oxford, United Kingdom.

"Definition of Buffer by Merriam-Webster", Retrieved from Internet https://www.merriam-webster.com/dictionary/buffer Dec. 31, 2018, Merriam-Webster Inc., Springfield, MA.

\* cited by examiner

DEPOSITION APPARATUS AND USE METHODS

CROSS-REFERENCE TO RELATED APPLICATION

Benefit is claimed of U.S. Patent Application No. 62/011,103, filed Jun. 12, 2014, and entitled "Deposition Apparatus and Use Methods", the disclosure of which is incorporated by reference herein in its entirety as if set forth at length.

BACKGROUND

The disclosure relates to aerospace coatings. More particularly, the disclosure relates to vapor deposition systems.

Exemplary coating apparatus are shown in United States Patent Application Publication 20120282402A1 of Neal et al. published Nov. 8, 2012 and entitled "Coating Methods and Apparatus" and United States Patent Application Publication 20120196030A1 of Neal et al. published Aug. 2, 2012 and entitled "Coating Methods and Apparatus". A low vacuum operation (LVO) apparatus is disclosed in International Application PCT/US14/28489 of Brian T. Hazel et al., filed Mar. 14, 2014 and entitled "Deposition Apparatus and Methods".

SUMMARY

One aspect of the disclosure involves a deposition apparatus comprising: an infeed chamber a preheat chamber; a deposition chamber; and optionally at least one of a cooldown chamber and an outlet chamber. At least a first of the preheat chamber and the cooldown chamber contains a buffer system for buffering workpieces respectively passing to or from the deposition chamber.

A further embodiment may additionally and/or alternatively include a workpiece flowpath entering the infeed chamber and proceeding sequentially through the preheat chamber, the deposition chamber, the cooldown chamber, and then exiting the outlet chamber.

A further embodiment may additionally and/or alternatively include the preheat chamber being a combined preheat/cooldown chamber.

A further embodiment may additionally and/or alternatively include within the preheat/cooldown chamber, a workpiece flowpath having an infeed leg and an outfeed leg coincident at endpoints.

A further embodiment may additionally and/or alternatively include: the infeed chamber being a combined infeed/outlet chamber; the preheat chamber being a combined preheat/cooldown chamber; and a workpiece flowpath entering the infeed/outlet chamber and proceeding sequentially through the preheat/cooldown chamber, the deposition chamber, the preheat/cooldown chamber again, and then exiting the infeed/outlet chamber.

A further embodiment may additionally and/or alternatively include the buffer system comprising a conveyor having a plurality of receptacles.

A further embodiment may additionally and/or alternatively include the conveyor being a continuous loop circuit.

A further embodiment may additionally and/or alternatively include the buffer system comprising, along a workpiece flowpath from said infeed chamber to said outlet chamber: a first transfer mechanism positioned in the first chamber to transfer workpieces to said first chamber and a second transfer mechanism positioned in the first chamber to transfer workpieces from the first chamber.

A further embodiment may additionally and/or alternatively include the first transfer mechanism and the second transfer mechanism each comprising an arm mounted to be rotationally driven about an axis and translated parallel to said axis.

A further embodiment may additionally and/or alternatively include the buffer system comprising, along a workpiece flowpath: a first transfer mechanism positioned in the first chamber to transfer workpieces to said first chamber; a second transfer mechanism positioned in the first chamber to transfer workpieces from the first chamber; and an intermediate transfer mechanism positioned in the first chamber to shift the workpieces between a plurality of receptacles.

A further embodiment may additionally and/or alternatively include the plurality of receptacles including: a first receptacle accessible by the first transfer mechanism but not the second transfer mechanism; and a second receptacle accessible by the second transfer mechanism but not the first transfer mechanism.

A further embodiment may additionally and/or alternatively include the plurality of receptacles further including at least a third receptacle accessible by neither the first transfer mechanism nor the second transfer mechanism.

A further embodiment may additionally and/or alternatively include a workpiece flowpath from said infeed chamber to said outlet chamber comprising: a first leg from the infeed chamber to the deposition chamber; and a second leg from the deposition chamber to the outlet chamber, essentially parallel but opposite to the first leg.

A further embodiment may additionally and/or alternatively include the deposition chamber comprising: an electron beam gun; and an ingot.

A further embodiment may additionally and/or alternatively include the deposition chamber comprising a workpiece handler having a range of motion including: a first condition for receiving a workpiece transferred from the preheat chamber; and a second condition for handing off the workpiece for transfer to the cooldown chamber A further embodiment may additionally and/or alternatively include the workpiece handler range of motion including one or more deposition conditions accessible via rotation about a first axis relative to the first condition and second condition.

A further embodiment may additionally and/or alternatively include the one or more deposition conditions comprising: a first deposition condition for deposition from a first plume of a first material; and a second deposition condition for deposition from a second plume of a second material, said second deposition characterized by a shift parallel to the first axis relative to the first deposition condition.

A further embodiment may additionally and/or alternatively include the workpiece handler range of motion between said first condition and said second condition comprising a translation parallel to the first axis.

A further embodiment may additionally and/or alternatively include the workpiece handler range of motion including a part continuous rotation degree of freedom about an axis orthogonal to the first axis.

A further embodiment may additionally and/or alternatively include: a workpiece handler positioned to hold workpieces for coating in the deposition chamber; a transfer mechanism positioned to transfer workpieces between at least two of the chambers; a plurality of part holders, each having: a first feature complementary to an engagement feature of the workpiece handler; and a second feature complementary to an engagement feature of the transfer mechanism.

A further embodiment may additionally and/or alternatively include the first engagement feature comprising a tapered feature tapering toward a proximal end and the second engagement feature comprising a channel.

A further embodiment may additionally and/or alternatively include: the part holders each having an axis; the channel being open radially outward from the axis; and the tapered feature being centered along the axis.

A further embodiment may additionally and/or alternatively include a method for using the deposition apparatus to coat a plurality of workpieces. The method comprises: opening an inlet port of the infeed chamber; inserting one or more of the workpieces to the infeed chamber through its inlet port; closing the infeed chamber inlet port; pumping down the infeed chamber; opening a first transfer port between the infeed chamber and the preheat chamber; transferring the one or more workpieces through the first transfer port to the preheat chamber; heating the one or more workpieces in the preheat chamber; opening a second transfer port between the preheat chamber and the deposition chamber; transferring the one or more workpieces through the second transfer port to the deposition chamber; coating the one or more workpieces in the deposition chamber; opening a third transfer port between the deposition chamber and the cooldown chamber; transferring the one or more workpieces through the third transfer port to the cooldown chamber; cooling the one or more workpieces in the cooldown chamber; opening a fourth transfer port between the cooldown chamber and the outlet chamber; transferring the one or more workpieces through the fourth transfer port to the outlet chamber; opening an outlet port of the outlet chamber; and removing the one or more of the workpieces from the outlet chamber through its outlet port.

A further embodiment may additionally and/or alternatively include: after the removing, closing the outlet port and pumping down the outlet chamber.

A further embodiment may additionally and/or alternatively include: the transferring to the deposition chamber leaving some of the workpieces in the preheat chamber.

A further embodiment may additionally and/or alternatively include the workpieces being held by a plurality of part holders, each having: a first feature; and a second feature. At least one of said transferrings comprises a transfer mechanism engaging the second feature to shift the part holder and install or remove the first feature from a complementary feature.

A further embodiment may additionally and/or alternatively include: the first engagement feature comprising a tapered feature tapering toward a proximal end. The second engagement feature comprises a channel and the complementary feature comprises a receptacle interior.

A further embodiment may additionally and/or alternatively include the part holders each having an axis. The channel is open radially outward from the axis and the tapered feature is centered along the axis.

A further embodiment may additionally and/or alternatively include the first feature being complementary to an engagement feature of a workpiece handler of the deposition chamber. The transfer mechanism is positioned in the first chamber to reach into an adjacent chamber during the associated said transferring.

A further embodiment may additionally and/or alternatively include a method for using the deposition apparatus to coat a plurality of workpieces. The method comprises: sequentially passing workpieces through the apparatus; and preheating a workpiece in the preheat chamber during the sequential coating of at least first and second prior workpieces in the deposition chamber.

A further embodiment may additionally and/or alternatively include the workpieces passing through the apparatus while held by workpiece holders that pass with the workpieces.

A further embodiment may additionally and/or alternatively include the workpiece being incrementally moved within the preheat chamber in conjunction with the sequential coating of the first and second prior workpieces.

Another aspect of the disclosure involves a workpiece holder for a deposition apparatus. The workpiece holder comprises: a first feature for holding the workpiece holder during deposition; and a second feature for engagement by a transfer mechanism for transferring the workpiece holder.

A further embodiment may additionally and/or alternatively include the first engagement feature comprising a tapered feature tapering toward a proximal end and/or the second engagement feature comprising a channel.

A further embodiment may additionally and/or alternatively include the workpiece holder comprising a nitride-coated metallic substrate.

A further embodiment may additionally and/or alternatively include the workpiece holder being in combination with a workpiece held by the workpiece holder wherein the workpiece comprises a gas turbine engine component.

Another aspect of the disclosure involves a part manipulator for a deposition system. The part manipulator comprises: a proximal section rotatable about a first axis and translatable along said first axis; a first intermediate section coupled to the proximal section by a first joint and extending radially outward from the first axis; a second intermediate section coupled to the first intermediate section by a second joint and rotatable relative to the first intermediate section about a second axis parallel to and offset from the first axis; and a receptacle coupled to the second intermediate section by a third joint and rotatable relative to the second intermediate section about a third axis transverse to the second axis.

A further embodiment may additionally and/or alternatively include one or more of: the proximal section comprising a coaxial tri-shaft; the third axis being orthogonal to and intersecting the second axis; and the receptacle being coupled to the second intermediate section for endless rotation about the third axis.

A further embodiment may additionally and/or alternatively include: a first actuator coupled to drive said rotation about said first axis; a second actuator coupled to drive said rotation about said second axis; a third actuator coupled to drive said rotation about said third axis; and a fourth actuator coupled to drive said translation along said first axis.

Another aspect of the disclosure involves a method for using a deposition apparatus to coat a plurality of workpieces. The method comprises: sequentially passing workpieces through the apparatus; and preheating a workpiece in a preheat chamber during the sequential coating of at least first and second prior workpieces in the deposition chamber.

A further embodiment may additionally and/or alternatively include the workpieces passing through the apparatus while held by workpiece holders that pass with the workpieces.

A further embodiment may additionally and/or alternatively include the workpiece being incrementally moved within the preheat chamber in conjunction with the sequential coating of the first and second prior workpieces.

A further embodiment may additionally and/or alternatively include the workpieces being gas turbine engine components and the coating being of a ceramic coating.

A further embodiment may additionally and/or alternatively include the workpieces being in the preheat chamber for at least 130% of a time they are in the deposition chamber.

The details of one or more embodiments are set forth in the accompanying drawings and the description below. Other features, objects, and advantages will be apparent from the description and drawings, and from the claims.

BRIEF DESCRIPTION OF THE DRAWINGS

Like reference numbers and designations in the various drawings indicate like elements.

DETAILED DESCRIPTION

Figure 1:
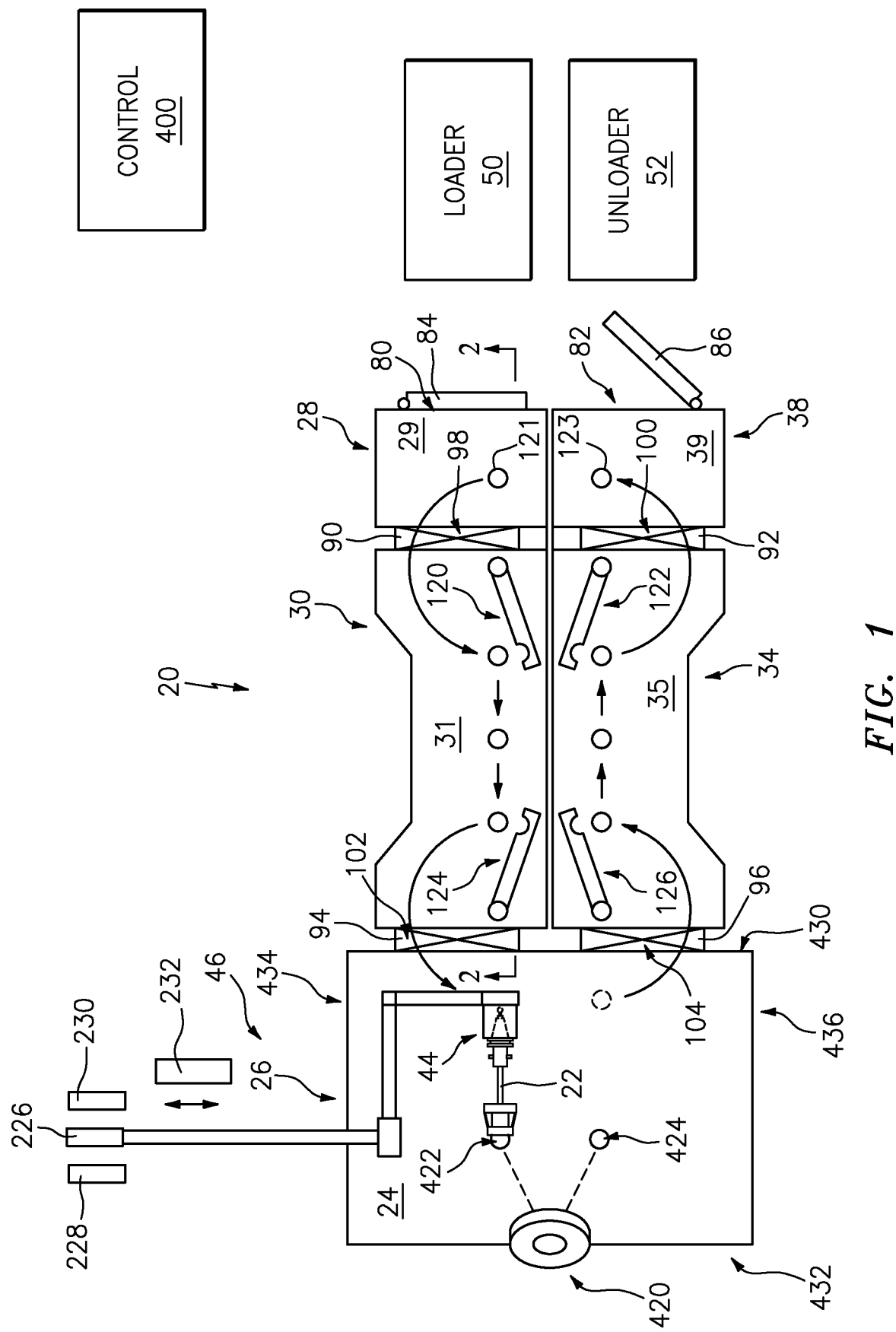
FIG. 1 is a partially schematic top view of a deposition system.

FIG. 1 shows a deposition system 20 for depositing coating on workpieces 22 in the interior 24 of a deposition or coating chamber 26. The system passes the workpieces downstream along a workpiece flowpath passing sequentially through a first load lock chamber 28 forming an infeed chamber and having an interior 29, a preheat chamber 30 having an interior 31, the deposition chamber 26, a cooldown chamber 34 having an interior 35, and a second load lock 38 forming an outlet chamber and having an interior 39.

In an alternate embodiment (not shown), there is no cooldown chamber 34. In this alternate embodiment, the system passes the workpieces downstream along a workpiece flowpath passing sequentially through a first load lock chamber 28 forming an infeed chamber and having an interior 29, a preheat chamber 30 having an interior 31, the deposition chamber 26, and a second load lock 38 forming an outlet chamber and having an interior 39.

In another alternate embodiment (not shown), there is no second load lock 38. In this alternate embodiment, the system passes the workpieces downstream along a workpiece flowpath passing sequentially through a first load lock chamber 28 forming an infeed chamber and having an interior 29, a preheat chamber 30 having an interior 31, the deposition chamber 26, and a cooldown chamber 34, which also acts as an outlet chamber, having an interior 35.

As is discussed further below, workpieces are carried through the system on part holders (fixtures) 44. Depending upon implementation, an individual fixture may hold a single workpiece or multiple workpieces. In the deposition chamber, the workpieces may be manipulated by means 46. An exemplary means is a sting mechanism discussed below.

In this example, a loading station (loader) 50 and an unloading station (unloader) 52 are schematically illustrated. These may be robots (e.g., six-axis industrial robots) to transfer fixtured workpieces from and to conveyors, pallets, and the like (not shown).

In operation, the deposition chamber operates at a high speed so that workpieces can be coated in less time than the required pre-heat time and cooldown time. For example, to coat a single part holder's workpiece(s), the chamber may require a time of $T_D$. The required or desired preheat time $T_{PH}$ may be an exemplary at least 130% of $T_D$ (e.g., at least 150% or at least 200% such as an exemplary 130%-500% or 150%-500%). An upper end on preheat time is not similarly limited. Once the part has reached temperature it may stay there for a reasonable time without affecting subsequent processing. Clearly, times on the order of tens to hundreds or more of $T_D$, or on the order of tens to hundreds or more of the minimum $T_{PH}$, may begin to detract from part life. However, economics suggests that anything more than needed to reach target temperature is an unnecessary loss to be minimized. Similarly, the required or desired cooldown time $T_{CD}$ may be an exemplary 50% of $T_D$ (e.g., 50%-300%). Cooldown time is less important than preheat time and influenced by different factors. Preheat time is determined by the desired preheat temperature/uniformity. Cooldown may be more influenced by handling considerations. Once coated, environmental conditions during cooldown may be less relevant than those during pre-heat.

To accommodate different required times in each of the chambers, the preheat chamber and cooldown chamber may each have multiple stations allowing them to contain multiple part holders and thus serve as buffers. The part holders may thus spend more time in the preheat chamber and the cooldown chamber than in the deposition chamber. Thus a given part holder will be in the preheat chamber or cooldown chamber during at least two cycles of other part holders being processed by the deposition chamber.

Figure 2:
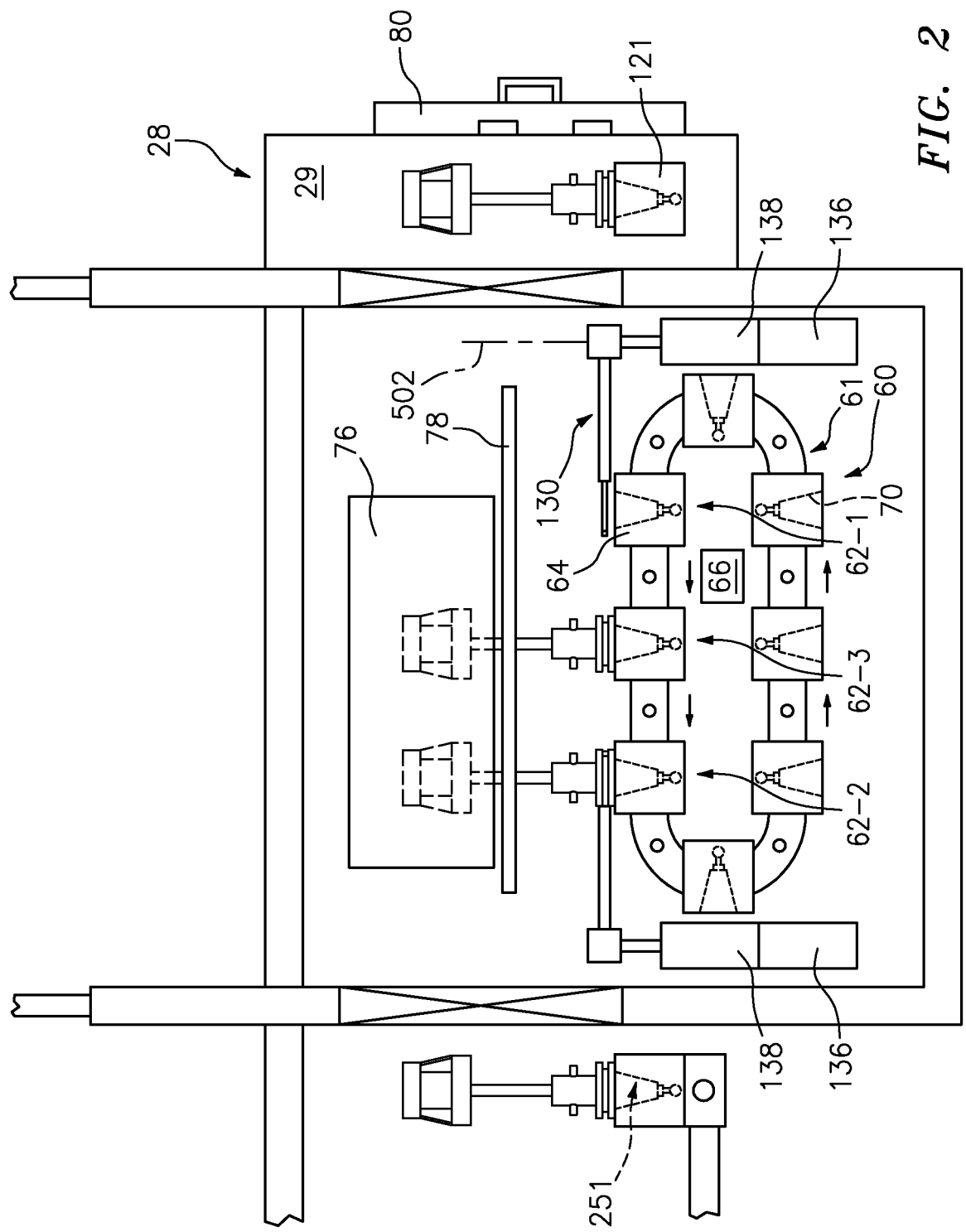
FIG. 2 is a partial vertical cutaway view of the system of FIG. 1, taken approximately along line 2-2.

In this example, the buffer systems 60 each comprise a carousel system 61 (FIG. 2) (e.g., a track, belt (e.g., on rollers), or linked apparatus forming a circuit). The buffer system has a number of locations 62 for holding workpieces. In the carousel example, these are occupied by receptacles 64. The system 60 has an actuator 66 (e.g., a stepper or other motor with appropriate gearing, drive chains and belts, and/or the like) for driving the carousel to circulate the receptacles along a circuit (e.g., shown as a racetrack or obround layout) through a plurality of locations. These plurality of locations comprise: a receiving location 62-1 for receiving a workpiece (inclusive of a plurality of co-fixtured workpieces); and a discharging location 62-2 for discharging the workpiece. In this example, there are one or more further locations 62-3 for buffering workpieces. Discussed further below, the receptacles have a feature (e.g., a compartment) 70 (FIG. 2) complementary to a feature of the part holder 44. FIG. 2 schematically shows that a pair of heating elements 76 may be alongside opposite sides of a flowpath leg of the workpieces through the preheat chamber to shield the carousel from the heating elements above. Similarly, a pair of thermal shields 78 may be along opposite sides of the flowpath (e.g., defining a narrow slot between for a shaft of a parts holder to pass). Such heating means may be eliminated from the cooldown chamber.

In this example, the inlet chamber has an inlet port 80 and the outlet chamber has an outlet port 82. These may be closeable via appropriate gate valves or other doors 84, 86. Between chambers, there will be one or more ports or doors. For example, a single door may be located between adjacent chambers and may be formed by gate valve assemblies schematically identified as 90, 92, 94, and 96 defining ports 98, 100, 102, 104 between chambers.

The system also includes means for transferring the fixtured workpieces to and from the buffer systems. FIG. 1 shows means: 120 for transferring workpieces from the chamber 28 (e.g., a receptacle 121 in the chamber 28) to the chamber 30; 122 for transferring workpieces from the chamber 34 to the chamber 38 (e.g., a receptacle 123 in chamber 38); 124 for transferring workpieces from the chamber 30 to the chamber 26; and 126 for transferring workpieces from the chamber 26 to the chamber 34. The means may be general purpose robots (e.g., six axis industrial robots optionally with a specialized end effector or with a generic gripper end effector) or may be specialized transfer mechanisms. As is discussed further below, each exemplary means is based on existing industrial tool changer technology. An exemplary tool changer technology is found in U.S. Pat. No. 6,641,511 of Patel et al., issued Nov. 4, 2003, and entitled "Movable arm activated tool changer for machine tool system." Such tool changer technology uses tool holders having a feature for mounting in the tool chuck (when in use) and in a magazine of a rotary changer (when not in use). The tool holder has another feature for engagement by some form of transfer mechanism for transferring the tool holder between the chuck and magazine.

Figure 1A:
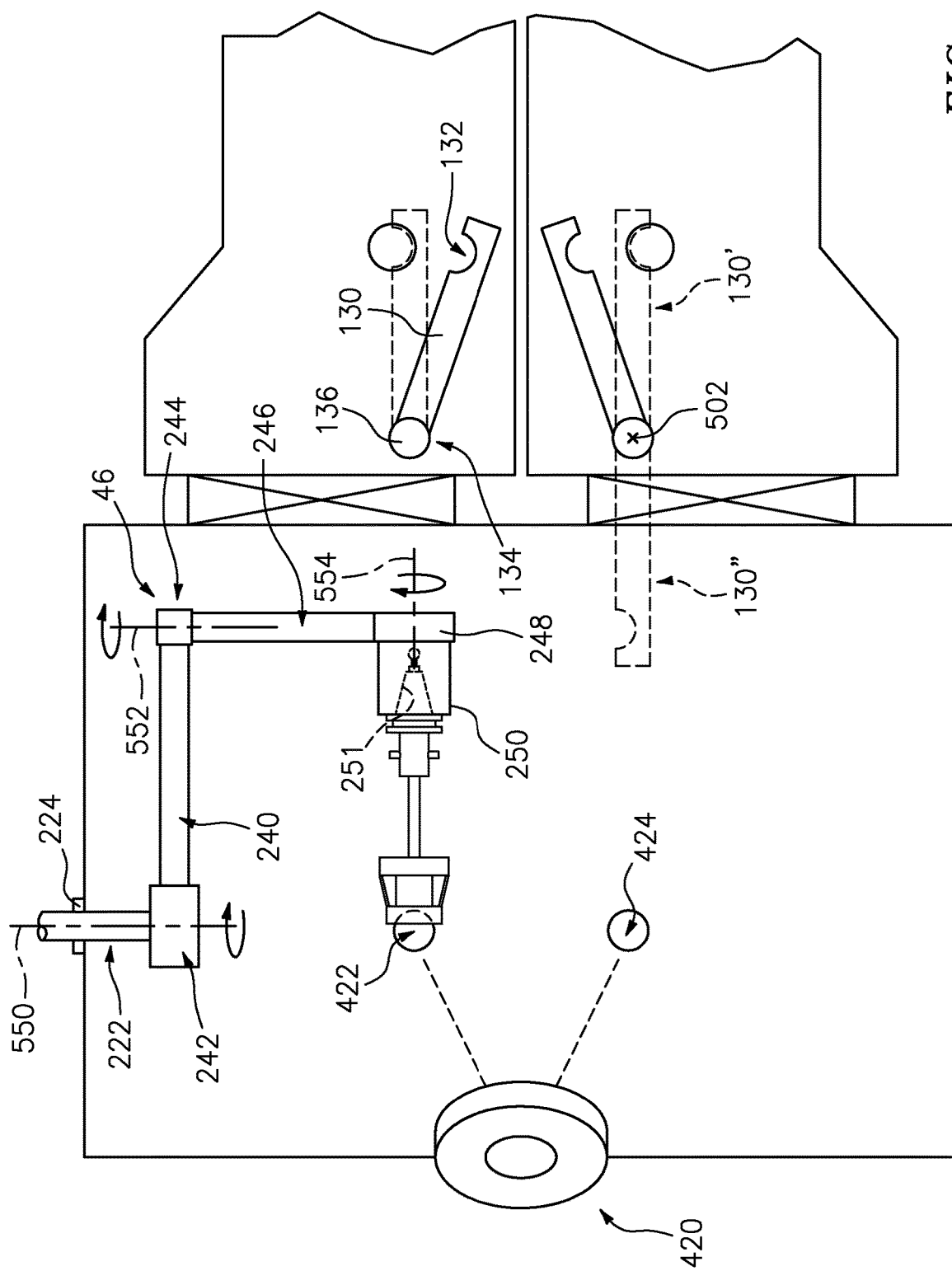
FIG. 1A is an enlarged view of a deposition chamber of view of the system of FIG. 1.

Each exemplary transfer means or mechanism comprises an arm 130 (FIG. 1A) having a distal end feature 132 for engaging the workpieces (or their fixtures in this example). A proximal end 134 is coupled to one or more actuators 136, 138 (FIG. 2) for actuating the arm to move the feature between a plurality of positions. The exemplary actuator 136 is a rotary actuator for rotating the arm 130 about an associated axis 502 (FIG. 1A). An exemplary actuator 138 (FIG. 2) is a linear actuator for translating the arm parallel to the axis 502. Rotationally, an exemplary three positions or conditions are shown in FIG. 1A: a solid line retracted/disengaged/idle condition where the means (e.g., the arm 130) does not block the associated port or interfere with the associated carousel or means 46 (deposition chamber sting mechanism); a carousel-transferring position/condition (shown as 130') for transferring a fixtured workpiece to or from the associated carousel; and a position/condition (shown as 130") for transferring to or from the associated load lock or the deposition chamber. With the exemplary transfer means located in the chambers 30 and 34, this last position/condition involves the transfer means reaching through the associated port. Translationally, the three conditions may also have one or more associated positions. For example, each may have a lowered condition/position corresponding to a workpiece (or its fixture) fully seated in an associated receptacle. A raised position may have the workpiece or fixture disengaged from such receptacle (allowing lateral movement by rotation about the axis 502).

When discussing such transfer means, the transfer means transferring workpieces into the subject chamber may be referred to as an infeed transfer means while the transfer means transferring workpieces out of such subject chamber may be referred to as an outfeed transfer means.

Figure 4:
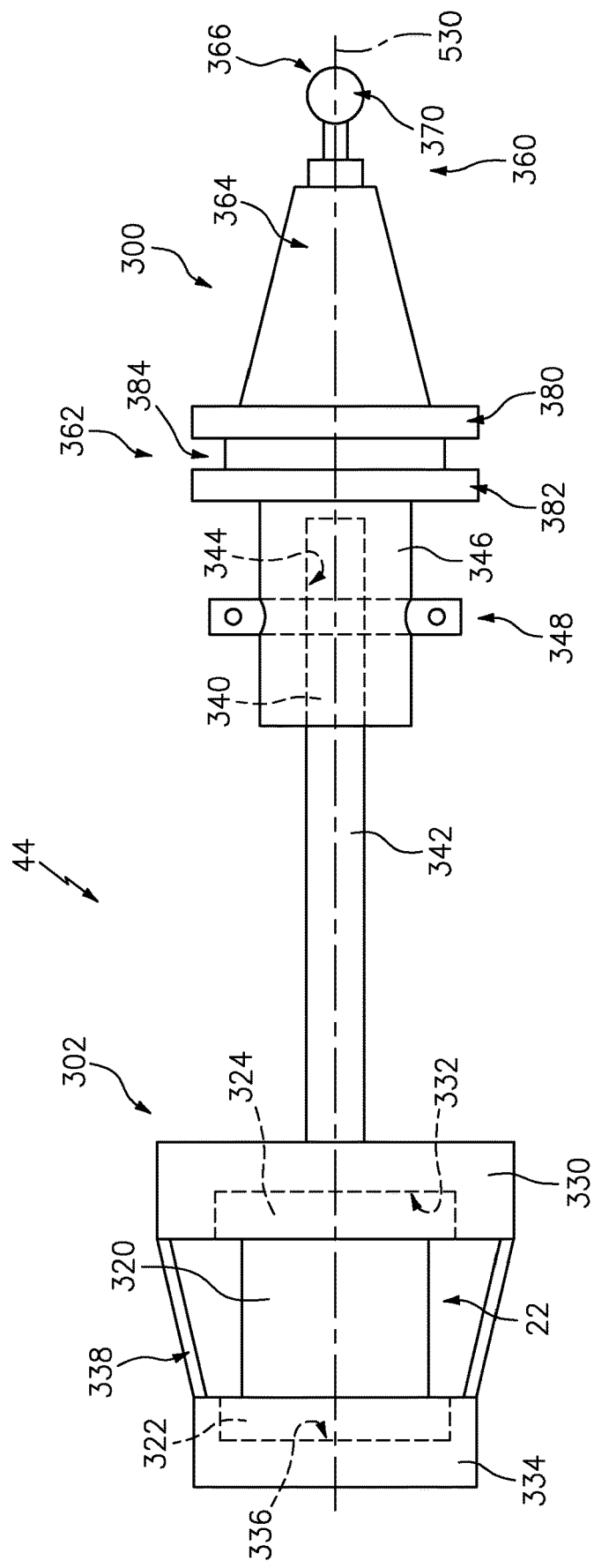
FIG. 4 is a partially schematic view of a fixtured workpiece.

The exemplary fixture 44 is shown in FIG. 4 as having two subsections or subsystems: a section 300 (mounting section) for mounting and handling; and a section 302 (fixturing section) for engaging the workpiece(s) 22. The exemplary illustrated tool chamber mounts a single workpiece 22. The exemplary workpiece 22 is shown as a vane having an airfoil 320 (e.g., having a leading edge, a trailing edge, and a pressure side and a suction side extending between the leading and trailing edges). The exemplary vane airfoil expands spanwise between an inboard or inner diameter (ID) platform 322 and an outboard or outer diameter (OD) shroud 324. The exemplary workpiece comprises a superalloy substrate (e.g., a nickel-, cobalt-, and/or iron-based superalloy). The substrate may bear a coating (e.g., prior to any coating applied in the apparatus). For example, the substrate may bear an MCrAlY bondcoat at least along key portions to be coated such as the airfoil exterior and gaspath-facing surfaces of the platform and shroud which are to be ceramic coated in the apparatus 20. The exemplary section 302 is formed as a fixturing section for holding the part. In the exemplary vane, the section 302 comprises a first portion 330 having a pocket 332 for receiving one of the shroud and platform (e.g., the shroud as shown). In this example, the fixture includes a second portion 334 having a pocket 336 engaging the other of the platform and shroud. Differently-configured fixturing sections would be appropriate for different components. A plurality of struts 338 connect the portions 330 and 334 to each other. In this example, the struts 338 hold the workpiece clamped between the portions 330 and 334 and may have clamps, fasteners (e.g., screws) and/or other means for at least partial removability or releasability to allow installation of and removal of the workpiece 22.

This exemplary workpiece holder 44 makes the section 302 removable from the section 300. This may serve one or more purposes including allowing differential use rates of the two and allowing one configuration of section 300 to be used with multiple configurations of section 302 corresponding to different configurations of workpieces to be coated.

To allow mating of the sections 300 and 302, these sections have interfitting features. Exemplary interfitting features comprise an end portion 340 of a shaft 342 of the section 302 received in a compartment 344 of a collar 346 of the portion 300. As an exemplary means for releasably locking the two together, a locking pin 348 may pass through bores in both the shaft portion 340 and collar 346 and may have spring detent mechanism or other locking feature to lock the pin in place. Alternative fastener-based systems may also be used.

The exemplary section 300 has a section 360 for engagement by the receptacles (e.g., the compartment 70, 251 of receptacles of the preheat chamber, the cooldown chamber, and/or the part manipulator of the deposition chamber). A separate feature 362 may be provided to allow engagement by the transfer mechanism for transferring. The exemplary section 360 comprises a feature such as a tapering portion 364 (taper). The exemplary tapering portion 364 tapers radially inward (relative to an axis 530) toward a proximal end 366 of the section 300. The exemplary taper 364 comprises a frustoconical surface which may be received by a complementary interior surface of said complementary receptacles (discussed further below). In addition to the taper 364, the exemplary section 360 comprises a further feature 370 which may serve one or more of several purposes including allowing locking or detenting of the workpiece holder 44 in the associated receptacle and/or allowing a precise axial positioning/registration of the workpiece holder in the receptacle. The exemplary feature 370 comprises a spherical protrusion at the end 366. This may be received in a complementary portion of the receptacle interior (e.g. having a detent mechanism to detent the holder 44 in an installed condition).

The exemplary section 362 is formed as a channel structure. The channel structure comprises a proximal flange 380, a distal flange 382, and a reduced diameter portion/area 384 therebetween. The outer diameter (OD) surface along the reduced diameter portion 384 and the adjacent faces of the flanges form a respective base and sidewalls of an annular channel about the axis 530. This allows a fork or other end effector 130 (FIG. 1A) of the transfer mechanism to engage the workpiece holder. For example, the arm 130 or fork may have parallel faces spaced apart by the width of the channel or slightly less than such width and may have a semi-circular or nearly semi-circular lateral recess 132 complementary to the portion 384. Such an end effector may approach the tool holder laterally with the channel 362 receiving adjacent faces of the end effector and the recess 132 receiving the reduced diameter portion 384. Translation of the end effector parallel to the axis 530 may remove the workpiece holder from the receptacle (e.g., via overcoming detent force on the feature 370). A reverse motion of the end effector parallel to the axis 530 (and axis 502) may install/seat the workpiece holder 44 in the receptacle, again overcoming detent force (if any) on the feature 370.

The exemplary deposition chamber 26 is configured for electron beam physical vapor deposition (EB-PVD). In this example, at least one electron beam (EB) gun 420 (FIG. 1) is positioned to direct its beam to one or more deposition material sources 422, 424 (FIG. 1). In this example, there are two distinct sources 422, 424 (ingots) of different materials. For example, there may be ceramics of different composition for forming distinct layers in a thermal barrier coating, erosion coating, abradable coating, or abrasive coating. For example, both may be zirconia-based such as having one being a yttria-stabilized zirconia (YSZ) such as 7YSZ and the other being a gadolinia-stabilized zirconia or a YSZ of different yttria content or other dopant. As is discussed further below, a part manipulator 46 may be used to position the workpiece(s) in two distinct positions or sets of positions associated with deposition from the two distinct sources (e.g., generally above the respective ingots so as to be approximately centrally positioned in the resulting vapor plume).

Other routine EB-PVD features are not shown but may be present. For example one or more vacuum pumps are coupled to each of the chambers with valves, pressure sensors, etc. to independently control pressure in the chambers. The deposition chamber will also be connected to process gas sources (e.g., cylinder banks of Ar, $O_2$, $N_2$, and/or He) by associated valves, etc. Various other sensors may be used to detect atmospheric compositions in the chambers and deposition parameters. Any chamber directly connected to the deposition chamber may also be connected to such gas sources to avoid contaminating the deposition chamber when the two are open to each other. Any chamber serving as a load lock may also have a gas source such as a dry air source (e.g., filtered/dehumidified factory air) used to pressurize the chamber prior to opening for loading or unloading. This, plus maintenance of gas flow while such chamber is open to the factory ambient conditions may prevent/limit infiltration of moist factory air into the system.

Figure 3:
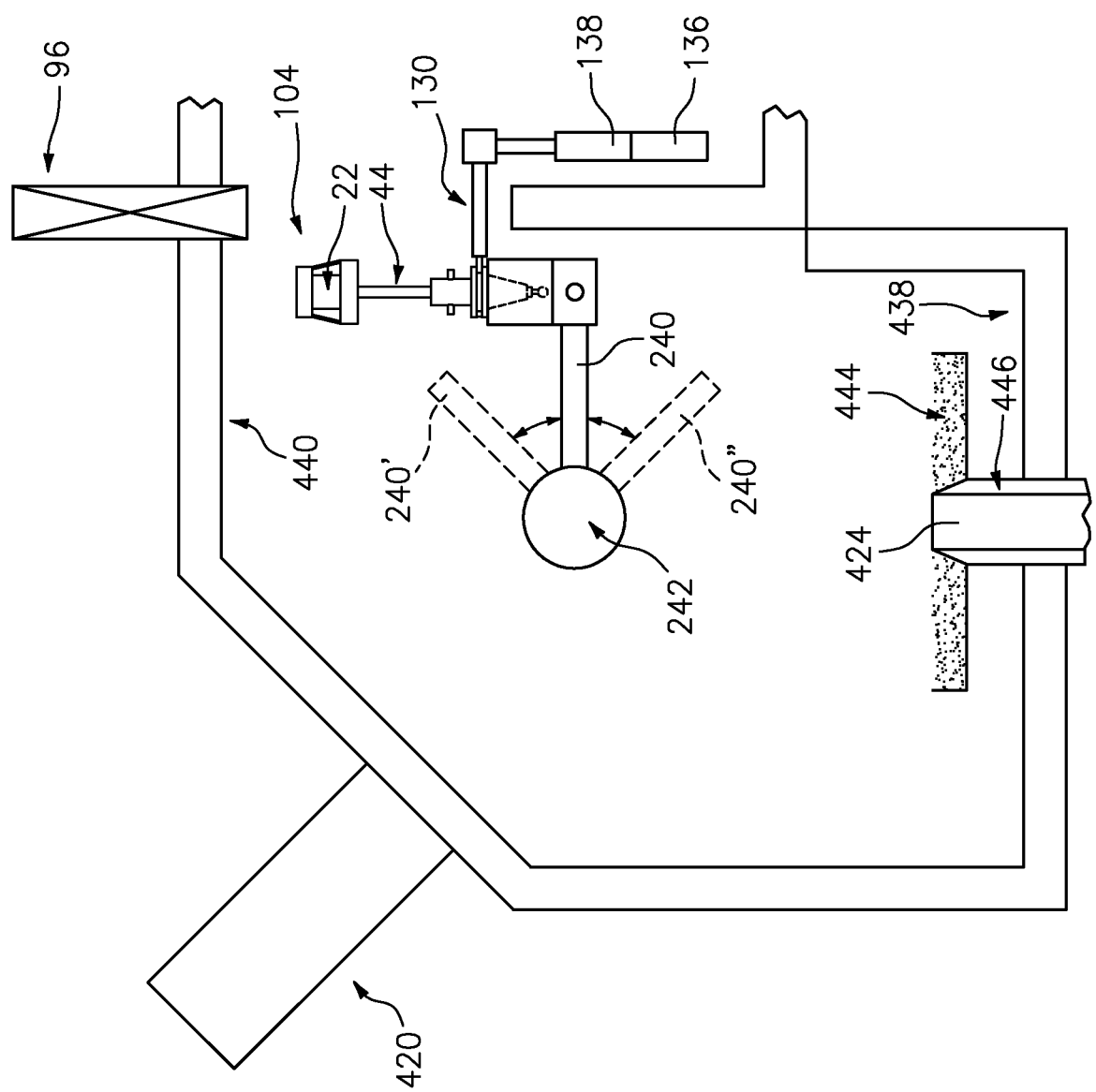
FIG. 3 is a partial vertical cutaway view of the system of FIG. 1, taken approximately along line 3-3.

In the exemplary implementation, a single electron beam gun 420 is positioned to be able to raster both ingots and may be coupled to a control system (controller 400 (FIG. 1)) to sequentially heat the two sources for the two stages of deposition (or more stages if more than two layers are involved). With the exemplary deposition chamber, both the preheat chamber 30 and the cooldown chamber 34 are along a first side 430 of the deposition chamber. The deposition chamber has a second side 432 opposite the first side and third and fourth sides 434, 436 transverse thereto. The chamber also has a bottom or lower side 438 (FIG. 3) and a top or upper side 440. The exemplary EB gun 420 is positioned centrally along a junction of the top 440 and second side 432 so as to diagonally point downward toward the bottom of the chamber. More particularly, the electron beam gun points diagonally downward toward a thermal tray 444 containing a ceramic media and surrounding a pair of associated crucibles 446 (e.g., via an ingot loader extending upward through a port in the bottom 438).

For manipulating the workpieces in the deposition chamber, a part manipulator 46 (FIG. 1A) is used. The exemplary manipulator is a sting and rake arm system. The exemplary sting and rake arm system has a tri-axial sting shaft 222 penetrating a seal 224 in the wall 434. The tri-axial sting shaft has three shafts (at least two of which are tubular) concentrically about an axis 550. Actuators (e.g., drive motors) 226, 228, 230 (FIG. 1) drive respective rotations of the three shafts and a further actuator 232 drives translation of the sting and rake arm parallel to the axis 550 (FIG. 1A). In the general, the concept of coaxial and tri-axial shafts is known. However, the particular orientation of components as discussed below is not believed known. Accordingly, the overall layout is illustrated and discussed schematically with the omission of internal bevel drive gears, etc. as these manufacture details would be within the skill of one of ordinary skill in the art when presented with this schematic layout.

Returning to FIG. 1, actuation by one of the actuators (e.g., 226) may rotate the sting and rake arm assembly in at least a range of motion about the axis 550. As is discussed below, this degree of freedom may help optimize workpiece orientation during deposition and may help bring the workpieces into and out of a transfer condition (e.g., an upright orientation) for transfer to and from the preheat chamber or cooldown chamber. Translation by the actuator 232 may, again, be used both to position the workpieces for transfer to the preheat chamber or cooldown chamber (in this example, transfer from the preheat chamber being in a relatively contracted condition of the sting and transfer to the cooldown chamber being in a relatively extended condition). However, this translation parallel to axis 550 may also place the workpieces in position aligned with the respective sources 422 and 424 (again respectively being in relatively contracted versus extended conditions).

The rake arm comprises a radial link or arm 240 (FIG. 1A) extending radially outward (relative to the axis 550) from a proximal end at a joint 242 with the sting shaft assembly 222. At a distal end of the arm 240, a joint 244 connects to a proximal end of an arm 246 having an axis 552 parallel to the axis 550. The arm 246 extends to a distal end at a joint 248 with a part-holding receptacle 250. The receptacle 250 has an axis 554 transverse to the axis 552. The joints 244 and 248 provide respective relative rotation about the axes 552 and 554 driven by the remaining actuators 228 and 230, respectively (e.g., via the bevel gear systems discussed above). The exemplary rotation about the axis 552 is used in conjunction with the rotation about the axis 550 to orient the workpiece relative to such axes. Again, this may be used to move between transfer conditions/positions and coating conditions/positions.

Exemplary materials for the components of the part manipulation system that have less exposure to heat in the coating chamber (222, 242, and 240 in FIG. 1A, and the internal triaxial shafts, not shown) include stainless steels such as 304, 316, and 316L stainless steel. Exemplary materials for the components of the part manipulation system that have more exposure to heat (e.g., 244, 246, and for the bevel gears (not shown) and the part holder receptacle 250 and part holder 44), include nickel-based superalloys such as Inconel 718. Section 302 of the part holder 44 can alternatively be fabricated out of stainless steels such as 304 or 316 stainless. The outer tubes of the part manipulation system can be fabricated by welding of tubing sections with either round or square cross sections. The bevel gear housings of joints 244 and 248 can be fabricated from machined cast IN718 preforms.

In an alternative embodiment (not shown), at least one portion of the part manipulation system 46 is protected from radiative heat flux using heat shields. This may include shielding of the receptacle and/or part holders. These heat shields may consist of at least one layer of sheet metal (typically stainless steel) or nickel-based alloys. These heat shields are attached to outer surfaces of at least one component of the part manipulation system, typically using a clamshell-type design held together with safety-wired bolts.

In another alternative embodiment (not shown), at least one portion of the part manipulation system 46 is water cooled to minimize distortion by the heat in the coating chamber. The sections of the part manipulation system that would be water cooled would have a copper tubing circuit brazed to the outer surface of the component. The component and water cooling surface would then be protected from the coating environment using a sheet metal shroud consisting of at least one layer of sheet metal, comprised of stainless steel or nickel-based alloys. The sheet metal shrouds would optionally not be used around the bevel gear housings of joints 244 and 248, nor the part holder receptacle, 250, because the housings themselves would protect the copper tubing. The inlet and outlet water plumbing to the copper tubing circuit would be routed through the innermost of the triaxial shafts, and would consist of copper tubing.

In this example, the transfer positions have the receptacle 250 facing upward. The receptacle 250 has a compartment 251 complementary to the workpiece holder as is discussed above. In the transfer conditions/positions, the workpiece holder extends upward from the receptacle. In such transfer conditions, the receptacle may be at even height with the advent terminal receptacle of the associated preheat chamber or cooldown chamber or at least within the vertical range of motion of the associated transfer mechanism. For deposition, rotation about the axis 552 and/or 550 may bring the part downward into closer proximity with the sources or the motion about axis 550 may pitch the part about the axis to change the angle of axis 554 relative the floor 438 but without bringing the part closer to the sources. During deposition, rotation about the axis 554 may help provide evenness of part coating. For example, this rotation may be a continuous rotation during deposition (e.g., at exemplary speeds of up to 300 rpm (e.g., more particularly, 100-200 rpm or 100-300 rpm, in a relatively fast deposition process). The movements about the axes 550 and 552 may have restricted/limited ranges of motion. For example, exemplary ranges of motion for each are 90°.

In the exemplary tri-axial sting shaft configuration, the rotation about the axis 554 is driven by the center shaft, rotation about the axis 550 driven by the outer shafts, and rotation about the axis 552 driven by the intermediate shaft. The exemplary actuator 232 may be a linear actuator such as a stepper motor engaging a rack and pinion or may be a linear motor.

Various surfaces which may be in the deposition chamber or otherwise exposed to deposition materials may bear protective coatings. One function of the coatings is to prevent sticking of coating material. Exemplary coatings are nitride coatings (e.g., TiN or TiAlN) disclosed in U.S. Pat. No. 8,603,582 of Bernaski et al., issued Dec. 10, 2013, and entitled "Non-stick masking fixtures and methods of preparing same", the disclosure of which is incorporated by reference in its entirety herein as if set forth at length.

For example, all or some of the surfaces of the part holder 44 and/or receptacle 250 may be coated reduce adhesion of any stray ceramic coating that reaches these surfaces during ceramic coating in the deposition chamber. Such coatings may enable easy cleaning of those surfaces. The coatings may also reduce friction and stiction during removal of the part holder from the receptacle 250. It similarly may reduce friction between mating surfaces of the partholder sections 300 and 302. It similarly may reduce friction between individual movable parts of those sections such as clamps and fasteners used to hold the part.

Thus, the same coating that acts as a non-stick coating along exposed areas of the part holder (or other component) may act as an anti-friction coating for mating surfaces of the part holder and/or receptacle (e.g., section 360 and receptacle compartment 251 (or 250)). In an exemplary coating process, the surfaces to be coated with TiN or TiAlN may be prepared for that coating by polishing (e.g., to a surface roughness of 25 Ra or lower) for strong adhesion of the TiN or TiAN coating. The coating may be applied to the surfaces by physical vapor deposition or chemical vapor deposition. Alternatively, the coating may be applied to the part by plating followed by nitriding.

Exemplary coating thickness is at least 1 micrometer or at least 2 micrometers or in a range of 1-10 micrometers, more particularly, 1-5 micrometers, 2-5 micrometers or 3-5 micrometers (e.g., measured as a mean, median, modal, or local thickness). Exemplary coatings are along majorities of the exposed areas of the partholder and along a majority of partholder surface area of contact zones between its pieces and between it and the receptacle.

An exemplary part movement sequence is described in a system having four locations/positions along the part flowpath in the preheat chamber rather than the illustrated three. In this example, cycle time for the deposition chamber is 5 minutes. Use of four positions in the preheat chamber for heating allows the parts to spend up to approximately 20 total minutes in the preheat chamber. A sequence of parts is referred to as "Part 1" et seq. In continuous operation, there will be a queue of parts along the part flowpath in the apparatus ahead of Part 1.

In the exemplary embodiment only a nominal 15 minutes is spent in the preheat chamber. The heating elements are partially clear of the first and fourth positions (e.g., adjacent only the side that is not in the way of the approach of the transfer apparatus) to allow access by the associated transfer apparatus. Thus little heating would occur in the first position. Accordingly, during most of the 5 minute system cycle a part is not in the first position.

The process sequence is started by opening door 84. Via loader 50 (or manually), Part 1 is loaded into load lock chamber 28's receptacle through port 80. Door 84 is then closed and the vacuum line valve (not shown) is opened to pump down the chamber interior 29 to achieve low vacuum operating (LVO) pressure (e.g., less than 30 Pa, more particularly 1.0-20 Pa or 5-20 Pa or 5-15 Pa or 10-15 Pa).

Gate valve 90 is then opened and the transfer mechanism 120 is used to engage part holder feature 362 (FIG. 4) for Part 1 and to move the holder 44 with that part into racetrack position 1 (e.g., 62-1 in FIG. 2). Gate valve 90 is then closed and the preheat chamber may optionally be pumped further down below LVO pressure or to establish a relatively inert atmosphere (e.g., by flowing argon or nitrogen from a supply (not shown) maintained at pressure via cooperation with a vacuum pump (not shown)).

Load lock chamber 28 vacuum line is then closed and the load lock is pressurized (e.g., with air from an air source to atmospheric pressure) to load Part 2.

Because, at the startup of the machine, no parts are in positions ahead of Part 1 in the preheater, immediately after Part 1 is transferred to position 1, the conveyor is actuated (e.g., via actuator 66) to move Part 1 to racetrack position 2 (e.g. the first of two intermediate positions). This step may occur while the load lock is being pressurized or even before.

Part 1 is then held at position 2 for an interval (e.g., the remainder of the 5 minute cycles to start pre-heat). The sequence is then repeated with further parts until part 1 is at racetrack position 4 (62-2), part 2 is at position 3 (the second of two positions 62-3), part 3 is at position 2, and part 4 has just been loaded into position 1. At this point, gate valve 90 has just been closed. However, at this point, the racetrack can't be indexed until part 1 is removed.

During this loading of the buffer in the preheat chamber, evaporation is started in the coating chamber, by using the electron beam to melt ingot 422, and the process is brought to steady-state, prior to transfer of Part 1 from the preheat chamber to the deposition chamber.

At this point in the startup sequence, Part 1 has experienced substantial ramp-up heating for two five minute intervals in positions 2 and 3 and a stabilization in position 4 for a 5 minute interval. Part 1 is thus fully preheated and ready for transfer to the deposition chamber.

A shutter (not shown) may be shifted (e.g., lowered) between positions 3 and 4 (e.g., the last two positions along the delivery flowpath) to shield the heating elements around positions 1, 2 and 3 from contamination by any residual deposition material vapor when Part 1 is transferred to the deposition chamber.

In another embodiment (not shown), a gate valve (in place of the shutter discussed in the above paragraph) is lowered between positions 3 and 4. Then the pressure in the volume surrounding Part 1 in position 4 is equalized by closing the vacuum line (not shown) and flowing inert process gases such as N$_2$ and Ar prior to the next step (described below). This latter embodiment enables maintaining positions 1, 2, and 3 in the preheat chamber at higher vacuum levels (lower pressures), avoiding nonoptimal oxidation.

Part 1 is transferred from position 4 in the preheat chamber to the triaxial manipulator in the coating chamber as follows. Feature 362 of the Part 1 part holder is engaged with transfer mechanism 124. At the same time, the rake arm part receptacle 250 is moved to a position along the arc of mechanism 124 in order to receive the part holder. The rake arm receptacle 250 is oriented such that its longitudinal axis 554 is vertical in the chamber by rotating about axis 552.

Gate valve 94 is opened and the holder holding Part 1 is moved over the rake arm receptacle 250 using the transfer mechanism 124. Part 1 is then lowered into the rake arm receptacle 250. The part holder may seat with a detent action, or a solenoid or other non-detent latching mechanism (not shown) may be used to lock the holder in place. Such a latching mechanism may be desirable because the rake arm manipulations of the part holder may involve inertial forces that would overcome a detent action commensurate with the strength of the transfer mechanism.

The transfer mechanism 124 is then retracted. Gate valve 94 is then closed, and the shutter, if any, retracted/raised. For the alternative embodiment that uses a gate valve instead of a shutter, the vacuum line is then opened to pump the volume around position 4 in the preheater down to the desired high vacuum level.

The racetrack is then indexed using the actuator 66 to move Part 2 to position 4, Part 3 to position 3, and Part 4 to position 2. Part 5 is then loaded into position 1 (similarly to how the other parts were so loaded). Alternatively, Part 5 may be loaded late in that 5-minute cycle. This completes the startup sequence for filling the buffer in the preheater. The process described above is repeated to maintain steady-state operation.

After gate valve 94 is closed after the transfer of Part 1, rotation of Part 1 around axis 554 is started immediately and the rake arm is rotated around axis 552 to bring axis 554 parallel to the melt pool on ingot 422. The part is then tilted as per a duty cycle by rotating around axis 550 between angles −A and +B, where A and B vary from 0 to 45 degrees, depending on the geometry of the part. This tilting occurs at the same time of the rotation of Part 1 around the axis 554, to ensure uniformity. The rate of rotation about axis 554 and tilting about axis 550 may not be constant, and rotation and tilting may be stopped for dwells at regular intervals. Tilting rates vary from 0.5 to 20 degrees per second, and dwell times vary from 0 to 20 seconds. An exemplary amount of time to coat the first layer using ceramic ingot source 422 is 1 minute. An exemplary composition for the first layer is 7YSZ.

Next, the EB gun raster pattern is moved from source 422 to source 424 to melt and evaporate ingot source 424, simultaneously freezing ingot source 422. Simultaneously or shortly before or after switching rastering, the actuator 232 is used to move the part over ingot source 424. An exemplary amount of time to coat the second layer using ceramic ingot source 424 is 4 minutes. An exemplary composition for the first layer is a gadolinia stabilized zirconia (GSZ) (e.g., 59 wt. % gadolinia stabilized zirconia). Other times and other combinations of layering may be involved. The total time may be up to essentially equal the part cycle time.

At all times, the cooldown chamber 34 is maintained at LVO pressure using process gas flowmeters in a feedback loop with a vacuum pump (neither shown). At the end of the coating cycle for Part 1, the rake arm is rotated to bring the part and part holder back up to the vertical position by rotating around axis 552. The manipulator 240 simultaneously translates into a transfer position along the arc of transfer mechanism 126. Gate valve 104 is then opened, transfer mechanism 126 engages feature 362 of the Part 1 part holder, then the rake arm solenoid (not shown) releases ball 370 and the part is moved into the cooldown chamber first position. Gate valve 104 is then closed and the rake arm is moved back to the position to receive Part 2 from the preheat chamber and the cycle of feeding the deposition chamber continues.

Part 1 is then moved through the cooldown chamber as parts complete the coating cycle and are moved in behind Part 1. Before Part 1 reaches the final position in the cooldown chamber, the outlet loadlock chamber 38 is pumped down to the same LVO pressure as the cooldown chamber. When Part 1 reaches the final position in the cooldown chamber, gate valve 100 is opened and mechanism 122 is used to transfer the part to the outlet load lock chamber. Gate valve 100 is then closed, and the outlet loadlock chamber 38 is vented to bring the pressure up to atmospheric pressure. Door 86 is opened and the part is then unloaded using unloader 52, or manually.

In an alternative embodiment (not shown), no cooldown chamber is used, and the part is moved directly from the coating chamber to the loadlock. The part is then quenched using flowing gas such as Ar, $N_2$, He, or air, with the vacuum line for the outlet load lock (not shown) closed, allowing the chamber to come up to atmospheric pressure. Door 86 is opened, then the part is then removed from the loadlock using 52 or manually, allowing sufficient time to pump down to LVO pressures to receive the next part coming out of the coating chamber.

Figure 5:
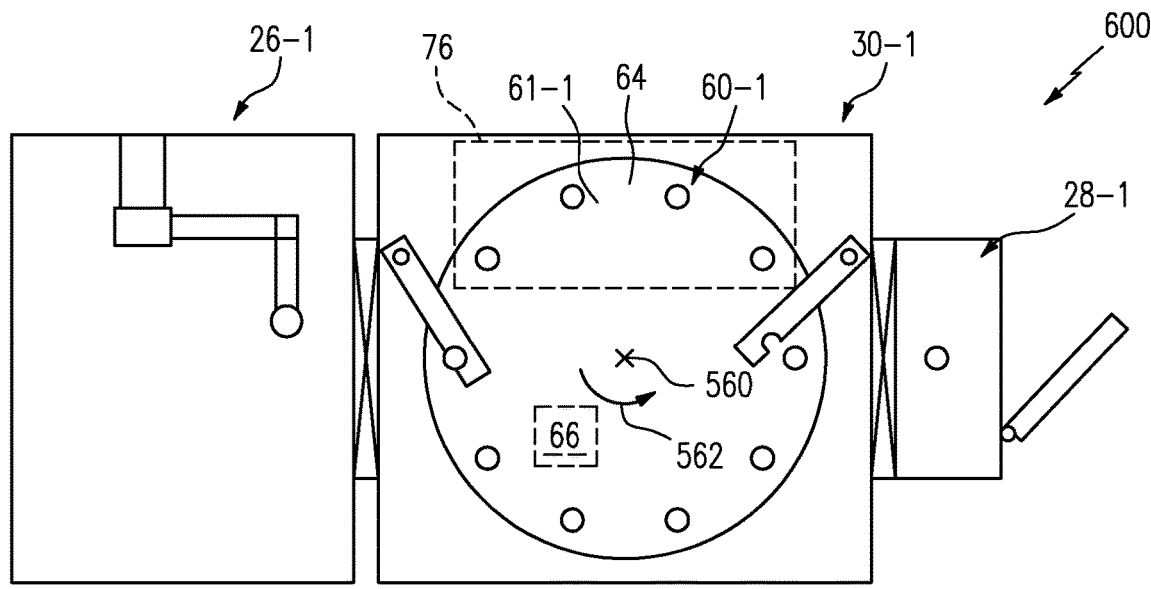
FIG. 5 is a partially schematic top view of an alternative deposition system.

FIG. 5 shows a system 600 that implements a number of differences relative to the system 20 of FIG. 1. Various of these differences may be implemented individually or in other combinations.

The first variation is that the buffer system 60-1 carousel 61-1 is simply a single-axis 560 carousel having a circular array of even-spaced receptacles. In this regard, it also reflects a second variation in that the receptacles remain upright throughout (contrasted with the FIG. 1 embodiment rotating the receptacles about a transverse axis to have a return leg inverted). A further variation is that a single chamber 30-1 serves functions of both the preheat chamber and cooldown chamber. The heater 76 is localized to one side of the chamber for preheating; the opposite side serves as a return path for cooldown. Similarly, a single load lock chamber 28-1 is used for both inlet/infeed and outlet/outfeed purposes. A single loader/unloader mechanism (not shown) may service the load lock or two respective separate mechanisms may service the load lock as in FIG. 1. Again, one or both of these mechanisms may be replaced with manual handling.

Figure 6:
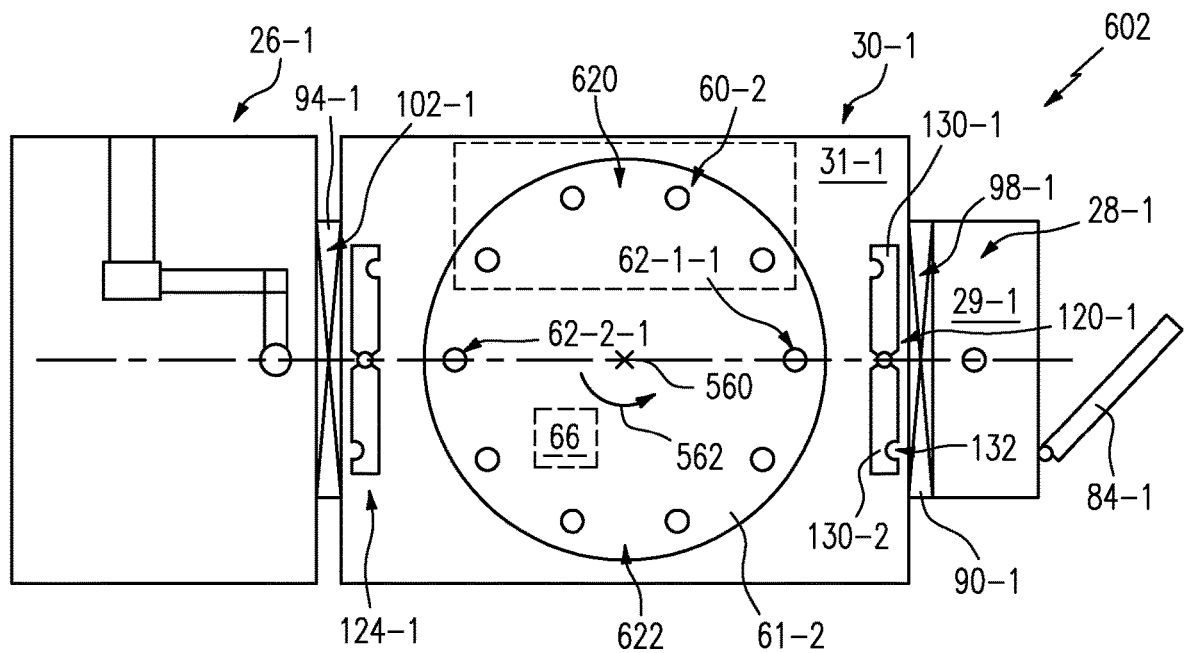
FIG. 6 is a partially schematic top view of another alternative deposition system.

FIG. 6 shows a system 602 having a buffer system 60-2 as further variation of the system of FIG. 5 wherein the transfer mechanisms 120-1, 124-1 each comprise two opposed arms 130-1 and 130-2. The exemplary arms may be formed as an integral unit (e.g., as opposite halves of a single piece on opposite sides of the axis of rotation 502). Each exemplary arm has a feature 132. Each exemplary feature 132 of the given transfer mechanism faces in the same circumferential direction (e.g., as an open channel or recess is open toward the same circumferential direction). This allows one rotation of the transfer mechanism to bring one arm into engagement with a tool holder in one of the carousel 61-2 receptacles in an associated location 62-1-1, 62-2-1 and the other into engagement with a tool holder in either the load lock 28-1 or the deposition chamber 26-1. A single translation along the axis 502 may serve to disengage both tool holders from the association receptacle. This may be followed by rotation about the axis 502 so as to exchange the locations of the two part holders. In yet alternative versions, however, such two-armed transfer mechanisms may be used in methods wherein only one of the two arms is engaging a tool holder at a given time.

Whereas, the FIG. 5 transfer mechanism axes 502 are off-center adjacent one vertical edge of the associated port through which they pass tool holders, the exemplary axes 502 are along the central vertical longitudinal centerplane in the FIG. 6 embodiment. This may require that the FIG. 6 embodiment have relatively wider ports 98-1, 102-1 than the FIG. 5 embodiment or the FIG. 1 embodiment. Additionally, the use of a single combined preheat and cooldown chamber with the exemplary FIG. 5 or FIG. 6 transfer mechanisms means that the sting arm loading and unloading positions can be coincident.

In this example, there is an even number of receptacles evenly circumferentially spaced about the carousel. With the FIG. 6 embodiment, an exemplary cycle is illustrated starting just after a part exchange has occurred with the deposition chamber. In this situation, at this point time, coated parts occupy both transfer positions 62-1-1, 62-2-1 and all the intermediate positions along the unloading flowpath (in the cooldown zone 622); uncoated parts occupying the intermediate locations in the preheating zone 620 adjacent the heating elements. An uncoated part is also in the load lock receptacle. The load lock has been pumped down to the pressure of the preheat/cooldown chamber. The valve 90-1 is then opened to expose the load lock 28-1 interior 29-1 to the interior 31-1 of the preheat/cooldown chamber 30-1. The transfer mechanism 120-1 then rotates (e.g., 90° about the axis 502) from an illustrated neutral or retracted condition to a condition where its respective arms 130-1 and 130-2 engage the receptacles in the adjacent transfer position 62-1-1 of the chamber 30-1 and the transfer position of the load lock 28-1. The arms are thereafter raised to disengage the part holders from the receptacles and then rotated 180° about the axis 502 to switch the parts between the associated chambers. Then the arms are vertically retracted to seat the part holders in their new receptacles. The arms are then rotated out of engagement (e.g., by 90°) back to the retracted condition.

The valve 90-1 may then be closed. Thereafter, and optionally coincident with the next movements discussed in the chamber 30-1, the vacuum of the chamber 28-1 may be broken, the door 84-1 opened, and then the coated part in the chamber 28-1 exchanged by the loader/unloader or separate loaders and unloaders for a fresh uncoated part. The process in the chamber 30-1 may be otherwise similar to that in the chamber 30. At some point in the cycle, the carousel 60-2 is indexed one position (e.g., counter-clockwise in direction 562 about axis 560 as viewed from above in the FIG. 6 example). This brings a heated workpiece into the operative position 62-2-1 for transfer to the deposition chamber. The exact timing of this indexing within the cycle may depend on a number of factors including the geometry of the heating elements. For example, if the heating elements do not provide adequate heat at location 62-2-1, this indexing may preferably occur late in the cycle. When coating/deposition is complete, the valve 94-1 is opened allowing communication through the port 102-1. The transfer mechanism 124-1 is then used to exchange parts between the deposition chamber and the receptacle in the location 62-2-1 in similar fashion to the exchange made by the mechanism 120-1. The gate valve 94-1 may then be closed and both the coating process in the deposition chamber and the above-mentioned actuations in the chambers 30-1 and 28-1 may repeat.

In yet a further variation, the recirculating loop of a carousel is replaced by a system wherein workpieces are moved between fixed receptacles. In one example, two receptacles are present. Both transfer mechanisms may access either receptacle. For example, with the rotary mechanisms already described and shown, the two receptacles may fall on two circular arcs: a first arc centered on the rotation axis of the first transfer mechanism; and a second arc centered on the axis of the second transfer mechanism. In a second such example, only one receptacle is at the intersection of the two arcs, but one or more additional receptacles are along the individual arcs. The infeed transfer mechanism might move the workpieces sequentially amongst the receptacles along its arc until the intersection receptacle. Thereafter, the outfeed transfer mechanism would acquire the workpieces and sequentially move them amongst the receptacles along its arc. A third such example might add a third transfer mechanism with a plurality of receptacles along a path (e.g., the arc of the exemplary transfer mechanisms). Terminal receptacles would be respectively accessible by the infeed and outfeed transfer mechanisms.

The use of "first", "second", and the like in the following claims is for differentiation within the claim only and does not necessarily indicate relative or absolute importance or temporal order. Similarly, the identification in a claim of one element as "first" (or the like) does not preclude such "first" element from identifying an element that is referred to as "second" (or the like) in another claim or in the description.

Where a measure is given in English units followed by a parenthetical containing SI or other units, the parenthetical's units are a conversion and should not imply a degree of precision not found in the English units.

One or more embodiments have been described. Nevertheless, it will be understood that various modifications may be made. For example, when applied to an existing baseline configuration, details of such baseline may influence details of particular implementations. Accordingly, other embodiments are within the scope of the following claims.

What is claimed is:

1. A deposition apparatus comprising:
    an infeed chamber;
    a preheat chamber;
    a deposition chamber; and
    optionally at least one of a cooldown chamber and an outlet chamber,
    wherein:
        at least a first chamber of the preheat chamber and, if present, the cooldown chamber contains a buffer system for buffering workpieces respectively passing to or from the deposition chamber; and
        the deposition apparatus further comprises:
            a workpiece handler positioned to hold workpieces for coating in the deposition chamber;
            a transfer mechanism positioned to transfer workpieces between at least two of the chambers;
            a plurality of workpiece holders, each having:
                a first engagement feature complementary to an engagement feature of the workpiece handler; and
                a second engagement feature complementary to an engagement feature of the transfer mechanism.

2. The deposition apparatus of claim 1 wherein:
    the deposition apparatus includes said cooldown chamber and said outlet chamber; and
    a workpiece flowpath enters the infeed chamber and proceeds sequentially through the preheat chamber, the deposition chamber, the cooldown chamber, and then exits the outlet chamber.

3. The deposition apparatus of claim 1 wherein:
    the preheat chamber is a combined preheat/cooldown chamber.

4. The deposition apparatus of claim 1 wherein:
    the buffer system comprises a conveyor having a plurality of receptacles.

5. The deposition apparatus of claim 4 wherein:
    the conveyor is a continuous loop circuit.

6. The deposition apparatus of claim 1 wherein a workpiece flowpath from said infeed chamber to said outlet chamber comprises:
    a first leg from the infeed chamber to the deposition chamber; and
    a second leg from the deposition chamber to the outlet chamber, parallel but opposite in direction to the first leg.

7. The deposition apparatus of claim 1 wherein the deposition chamber comprises:
    an electron beam gun; and
    an ingot.

8. The deposition apparatus of claim 1 wherein:
    the deposition apparatus includes said cooldown chamber; and
    the deposition chamber comprises a workpiece handler having a range of motion including:
        a first condition for receiving a workpiece transferred from the preheat chamber; and
        a second condition for handing off the workpiece for transfer to the cooldown chamber.

9. The deposition apparatus of claim 8 wherein the workpiece handler range of motion includes:
    one or more deposition conditions accessible via rotation about a first axis relative to the first condition and second condition.

10. The deposition apparatus of claim 9 wherein the one or more deposition conditions comprises:
    a first deposition condition for deposition from a first plume of a first material; and
    a second deposition condition for deposition from a second plume of a second material, said second deposition characterized by a shift parallel to the first axis relative to the first deposition condition.

11. The deposition apparatus of claim 9 wherein the workpiece handler range of motion between said first condition and said second condition comprises a translation parallel to the first axis.

12. The deposition apparatus of claim 9 wherein the workpiece handler range of motion includes:
    a part continuous rotation degree of freedom about an axis orthogonal to the first axis.

13. The deposition apparatus of claim 9 wherein:
    the rotation about the first axis reorients the workpiece relative to the to the first condition and second condition.

14. The deposition apparatus of claim 8 wherein the workpiece handler comprises a sting.

15. The deposition apparatus of claim 1 wherein:
    the first engagement feature comprises a tapered feature tapering toward a proximal end; and
    the second engagement feature comprises a channel.

16. The deposition apparatus of claim 15 wherein:
    the workpiece holders each have an axis;
    the channel is open radially outward from the axis; and
    the tapered feature is centered along the axis.

17. The deposition apparatus of claim 15 wherein:
    each of the plurality of workpiece holders has a fixturing section for engaging a workpiece; and
    the second engagement feature is between the fixturing section and the first engagement feature.

18. The deposition apparatus of claim 1 comprising said outlet chamber and wherein the deposition chamber has four sides and a workpiece flowpath from said infeed chamber to said outlet chamber comprises:
    a first leg from the infeed chamber to a first side of the four sides of the deposition chamber; and
    a second leg from the first side of the deposition chamber to the outlet chamber.

19. A method for using the deposition apparatus of claim 1 to coat a plurality of workpieces, the method comprising:
    opening an inlet port of the infeed chamber;
    inserting one or more of the workpieces to the infeed chamber through its inlet port;
    closing the infeed chamber inlet port;
    pumping down the infeed chamber;

opening a first transfer port between the infeed chamber and the preheat chamber;
transferring the one or more workpieces through the first transfer port to the preheat chamber;
heating the one or more workpieces in the preheat chamber;
opening a second transfer port between the preheat chamber and the deposition chamber;
transferring the one or more workpieces through the second transfer port to the deposition chamber;
coating the one or more workpieces in the deposition chamber;
opening a third transfer port between the deposition chamber and the cooldown chamber;
transferring the one or more workpieces through the third transfer port to the cooldown chamber;
cooling the one or more workpieces in the cooldown chamber;
opening a fourth transfer port between the cooldown chamber and the outlet chamber;
transferring the one or more workpieces through the fourth transfer port to the outlet chamber;
opening an outlet port of the outlet chamber; and
removing the one or more of the workpieces from the outlet chamber through its outlet port.

20. A method for using the deposition apparatus of claim 1 to coat a plurality of workpieces, the method comprising:
sequentially passing workpieces through the apparatus; and
preheating a workpiece in the preheat chamber during the sequential coating of at least first and second prior workpieces in the deposition chamber.

21. A deposition apparatus comprising:
an infeed chamber;
a preheat chamber;
a deposition chamber; and
optionally at least one of a cooldown chamber and an outlet chamber,
wherein:
at least a first chamber of the preheat chamber and, if present, the cooldown chamber contains a buffer system for buffering workpieces respectively passing to or from the deposition chamber; and
the deposition apparatus further comprises:
a workpiece handler positioned to hold workpieces for coating in the deposition chamber;
a transfer mechanism positioned to transfer workpieces to and from the deposition chamber;
a plurality of workpiece holders, each having:
a first feature complementary to an engagement feature of the workpiece handler; and
a second feature complementary to an engagement feature of the transfer mechanism whereby the workpieces may be transferred between the buffer system and the workpiece handler via the transfer mechanism.

* * * * *